(12) United States Patent　　　　(10) Patent No.: US 12,563,703 B2

North et al.　　　　　　　　　　　　(45) Date of Patent: Feb. 24, 2026

(54) HEAT DISSIPATION FOR AN INFORMATION HANDLING SYSTEM

(71) Applicant: Dell Products L.P., Round Rock, TX (US)

(72) Inventors: Travis C. North, Cedar Park, TX (US); Enoch Chen, Taipei (TW); Pomin Shih, Taipei (TW)

(73) Assignee: Dell Products L.P., Round Rock, TX (US)

( * ) Notice: Subject to any disclaimer, the term of this patent is extended or adjusted under 35 U.S.C. 154(b) by 169 days.

(21) Appl. No.: 18/454,916

(22) Filed: Aug. 24, 2023

(65) Prior Publication Data

US 2025/0071947 A1　Feb. 27, 2025

(51) Int. Cl.
H05K 7/20 (2006.01)
H01M 50/124 (2021.01)

(52) U.S. Cl.
CPC .... H05K 7/20427 (2013.01); H01M 50/1245 (2021.01); H01M 2220/30 (2013.01)

(58) Field of Classification Search
CPC .......... H05K 7/20427; H01M 50/1245; H01M 2220/30; H01M 10/613; G06F 1/1635; G06F 1/203; Y02E 60/10
USPC ........................................................ 165/133
See application file for complete search history.

(56) References Cited

U.S. PATENT DOCUMENTS

| | | | | |
|---|---|---|---|---|
| 8,958,209 | B2 * | 2/2015 | Morelle | .............. H01L 23/3733 |
| | | | | 361/764 |
| 10,164,220 | B1 * | 12/2018 | Lim | ......................... B32B 3/00 |

| | | | | |
|---|---|---|---|---|
| 10,182,514 | B2 * | 1/2019 | Hoffmeyer | ................ G06F 1/20 |
| 10,320,051 | B2 * | 6/2019 | Chiu | ................... H05K 7/20336 |
| 11,843,088 | B2 * | 12/2023 | Rich | .................. H01M 10/613 |
| 12,436,582 | B2 * | 10/2025 | Park | ......................... G06F 1/203 |
| 2011/0247795 | A1 * | 10/2011 | Horng | ................... H01L 23/373 |
| | | | | 165/185 |
| 2016/0044835 | A1 * | 2/2016 | Lee | ...................... H05K 1/0216 |
| | | | | 29/841 |
| 2017/0038803 | A1 * | 2/2017 | Bhardwaj | ........... H01M 50/222 |
| 2017/0062899 | A1 * | 3/2017 | Takahashi | ................ H01Q 1/02 |
| 2018/0177072 | A1 * | 6/2018 | Pando Rodriguez | ........................ |
| | | | | H01L 23/467 |
| 2018/0374714 | A1 * | 12/2018 | Stathakis | .............. H01L 23/367 |

(Continued)

FOREIGN PATENT DOCUMENTS

| | | | | | |
|---|---|---|---|---|---|
| CA | | 2717767 A1 * | 11/2009 | ........... | H01M 4/604 |
| CN | | 106374158 A * | 2/2017 | ......... | H01M 10/613 |

(Continued)

*Primary Examiner* — Len Tran
*Assistant Examiner* — Gustavo A Hincapie Serna
(74) *Attorney, Agent, or Firm* — McDermott Will & Schulte LLP

(57) ABSTRACT

An information handling system, including a cover including a first section and a second section; a first battery cell in superimposition with the second section of the cover; a second battery cell in superimposition with the second section of the cover, the second battery cell spaced-apart from the first battery cell to define a channel therebetween; a graphene coating in superimposition with the second section of the cover; and a first portion of a graphite sheet that is i) in superimposition with a first region of the second section of the cover, ii) in superimposition with the channel defined between the first battery and the second battery, and iii) in superimposition with a first portion of the graphene coating.

12 Claims, 9 Drawing Sheets

(56)　　　　　　　References Cited

U.S. PATENT DOCUMENTS

| | | | | |
|---|---|---|---|---|
| 2019/0190012 | A1* | 6/2019 | Wu | H01M 4/587 |
| 2020/0178415 | A1* | 6/2020 | Kim | H05K 7/20454 |
| 2020/0192430 | A1* | 6/2020 | McKittrick | H02J 7/04 |
| 2021/0028507 | A1* | 1/2021 | Su | H01M 10/6572 |
| 2021/0029855 | A1* | 1/2021 | Yoon | H05K 7/20509 |
| 2021/0100090 | A1* | 4/2021 | Chang | H05K 1/0201 |
| 2021/0105909 | A1* | 4/2021 | Ide | H04N 23/667 |
| 2021/0225584 | A1* | 7/2021 | Catalano | H01F 6/06 |
| 2021/0296716 | A1* | 9/2021 | Zhamu | H01M 10/613 |
| 2021/0313634 | A1* | 10/2021 | Zhamu | H01M 10/425 |
| 2021/0378086 | A1* | 12/2021 | Baba | H05K 7/2039 |
| 2022/0376202 | A1* | 11/2022 | Yang | H10K 59/8794 |
| 2022/0394874 | A1* | 12/2022 | Masuda | H01Q 1/243 |
| 2024/0268204 | A1* | 8/2024 | Fu | H05K 7/20518 |
| 2025/0287536 | A1* | 9/2025 | Kang | H05K 7/20336 |

FOREIGN PATENT DOCUMENTS

| | | | | | |
|---|---|---|---|---|---|
| CN | 107979942 | A | * | 5/2018 | H05K 7/20472 |
| CN | 108712853 | A | * | 10/2018 | G04G 17/04 |
| CN | 208142312 | U | * | 11/2018 | |
| CN | 109429444 | A | * | 3/2019 | H05K 7/20436 |
| CN | 107249284 | B | * | 7/2019 | H05K 7/20445 |
| CN | 209843896 | U | * | 12/2019 | |
| CN | 112911028 | A | * | 6/2021 | F28D 15/046 |
| CN | 113258033 | A | * | 8/2021 | H01M 10/0525 |
| CN | 115151076 | A | * | 10/2022 | H05K 7/2039 |
| CN | 115413212 | A | * | 11/2022 | H05K 9/0084 |
| CN | 116133345 | A | * | 5/2023 | H05K 7/2039 |
| CN | 116321969 | A | * | 6/2023 | H05K 7/20309 |
| EP | 4025023 | A1 | * | 7/2022 | H05K 7/20472 |
| WO | WO-2021083142 | A1 | * | 5/2021 | H05K 7/20336 |
| WO | WO-2022174267 | A1 | * | 8/2022 | H01M 10/0525 |

* cited by examiner

HEAT DISSIPATION FOR AN INFORMATION HANDLING SYSTEM

BACKGROUND

Field of the Disclosure

The disclosure relates generally to an information handling system, and in particular, a heat dissipation apparatus for the information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

Innovative aspects of the subject matter described in this specification may be embodied in an information handling system, including a cover including a first section and a second section; a first battery cell in superimposition with the second section of the cover; a second battery cell in superimposition with the second section of the cover, the second battery cell spaced-apart from the first battery cell to define a channel therebetween; a graphene coating in superimposition with the second section of the cover; and a first portion of a graphite sheet that is i) in superimposition with a first region of the second section of the cover, ii) in superimposition with the channel defined between the first battery and the second battery, and iii) in superimposition with a first portion of the graphene coating.

Other embodiments of these aspects include corresponding systems and apparatus.

These and other embodiments may each optionally include one or more of the following features. For instance, a second portion of the graphite sheet is i) in superimposition with a second region of the second section of the cover and ii) in superimposition with a second portion of the graphene coating. The first battery cell is i) in superimposition with the first region of the second section of the cover and ii) in superimposition with a third portion of the graphene coating. The second battery cell is i) in superimposition with the third region of the second section of the cover and ii) in superimposition with a fourth portion of the graphene coating. A third portion of the graphite sheet is in superimposition with the first section of the cover. The graphene coating is in thermal communication with the graphite sheet. The first portion of the graphene coating is positioned between the first portion of the graphite sheet and the first region of the second section of the cover. The first portion of the graphite sheet is positioned between the first portion of the graphene coating and the first region of the second section of the cover. The second portion of the graphene coating is positioned between the second portion of the graphite sheet and the second region of the second section of the cover. The second portion of the graphene coating is positioned between the second portion of the graphite sheet and the second region of the second section of the cover.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

Figure 1:
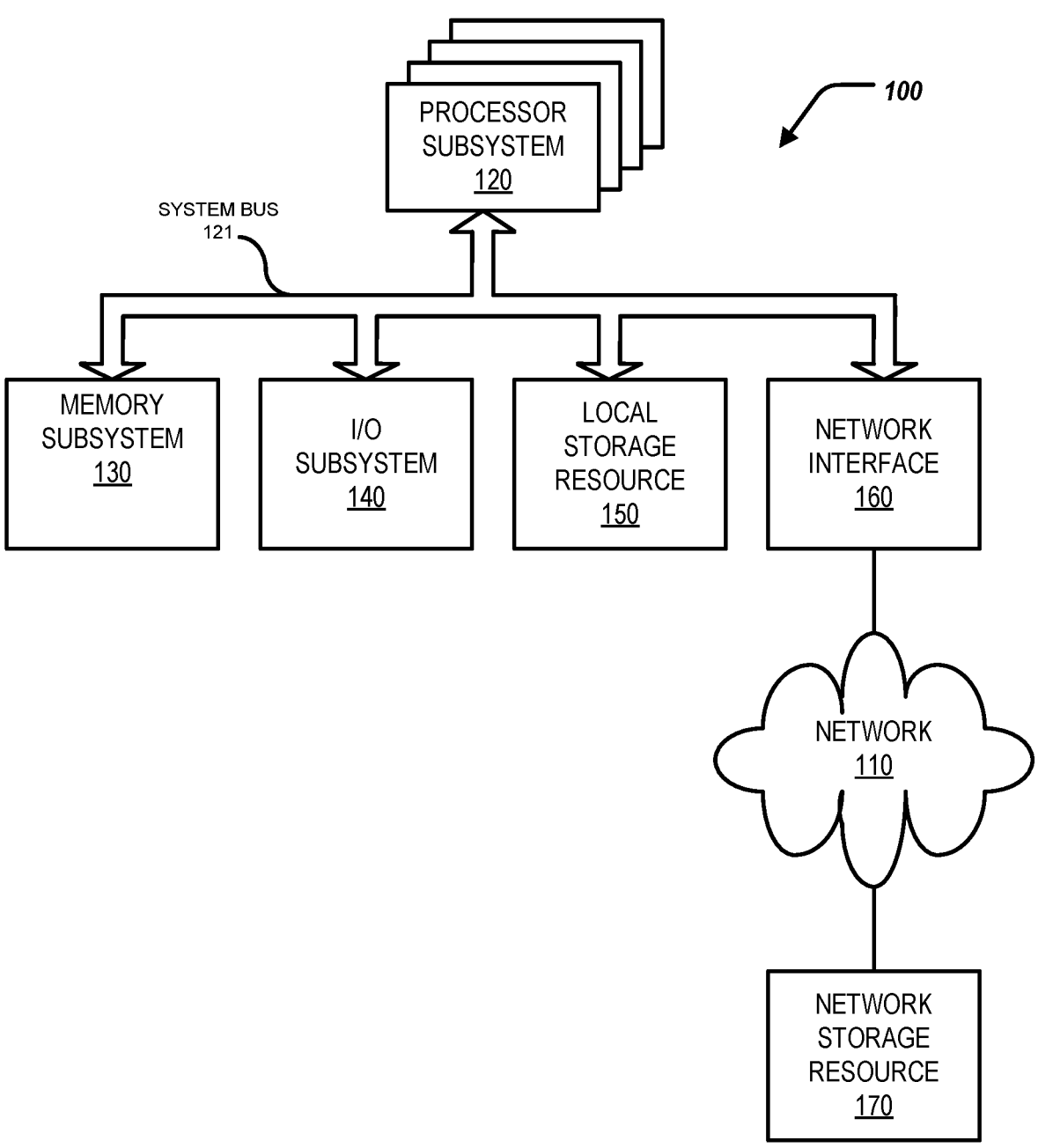
FIG. 1 is a block diagram of selected elements of an embodiment of an information handling system.

This disclosure discusses a heat dissipation apparatus of an information handling system. In short, heat generated by a computing element can be dissipated by a heat dissipation apparatus, including dissipation to areas proximate to a battery pack and between adjacent batteries.

Specifically, this disclosure discusses a system including a cover including a first section and a second section; a first battery cell in superimposition with the second section of the cover; a second battery cell in superimposition with the second section of the cover, the second battery cell spaced-apart from the first battery cell to define a channel therebetween; a graphene coating in superimposition with the second section of the cover; and a first portion of a graphite sheet that is i) in superimposition with a first region of the second section of the cover, ii) in superimposition with the channel defined between the first battery and the second battery, and iii) in superimposition with a first portion of the graphene coating.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-6 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

Figure 2:
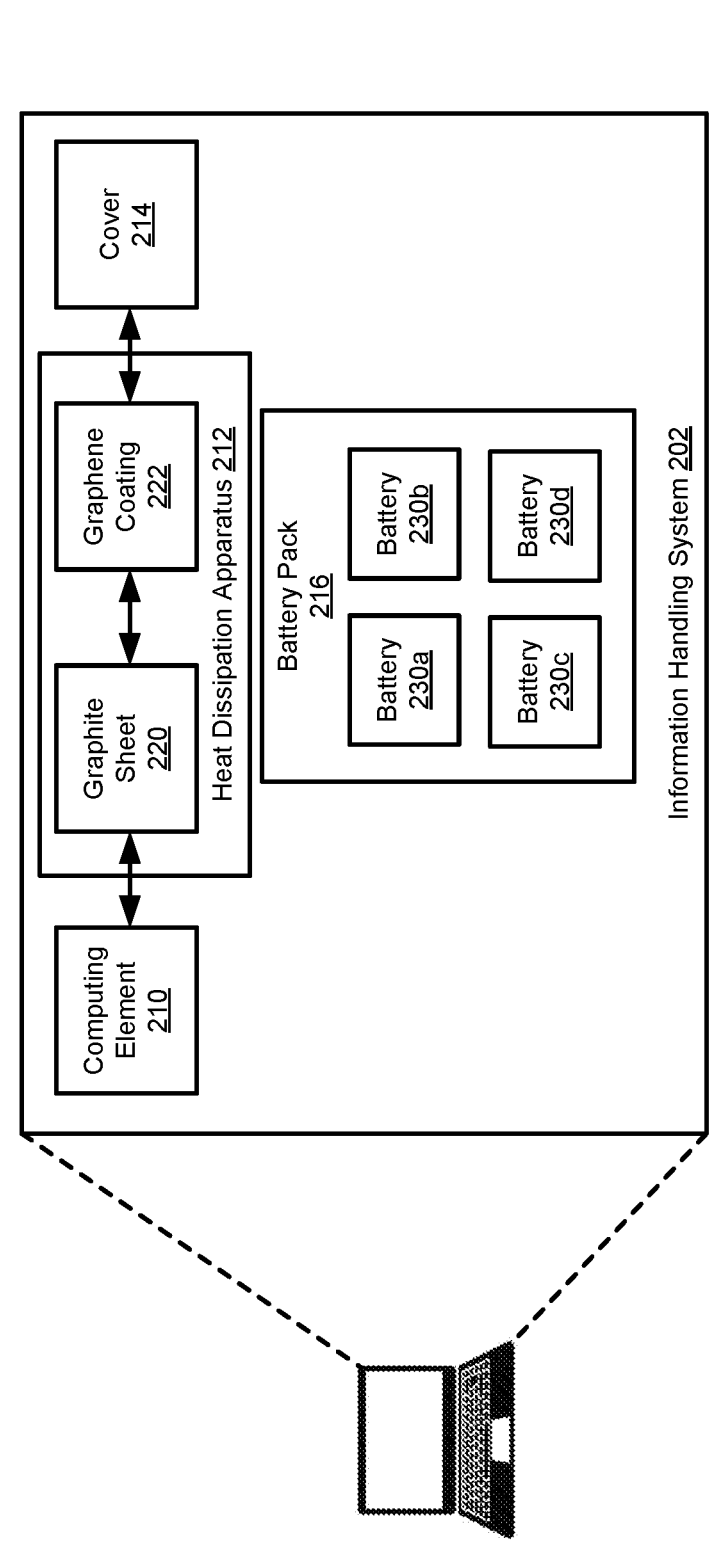
FIG. 2 illustrates a block diagram of an information handling system, including a heat dissipation apparatus.

Turning to FIG. 2, FIG. 2 illustrates an environment 200 including an information handling system 202. The information handling system 202 can include a computing element 210, a heat dissipation apparatus 212, a cover 214, and a battery pack 216. In some examples, the information handling system 202 is similar to, or includes, the information handling system 100 of FIG. 1. In some examples, the computing element 210 is the same, or substantially the same, as any of the processor subsystem 120, the memory subsystem 130, the I/O subsystem 140, the local storage resource 140, and/or the network interface 160 of FIG. 1.

The heat dissipation apparatus 212 can include a graphite sheet 220 and a graphene coating 222.

The battery pack 216 can include any number of battery cells (or batteries); for example, the battery pack 216 can include battery cells 230a, 230b, 230c, 230d (collectively referred to as battery cells 230 or batteries 230).

In short, heat generated by the computing element 210 can be dissipated by the heat dissipation apparatus 212, including dissipation to areas proximate to the battery pack 216 and between adjacent batteries 230.

Figure 3:
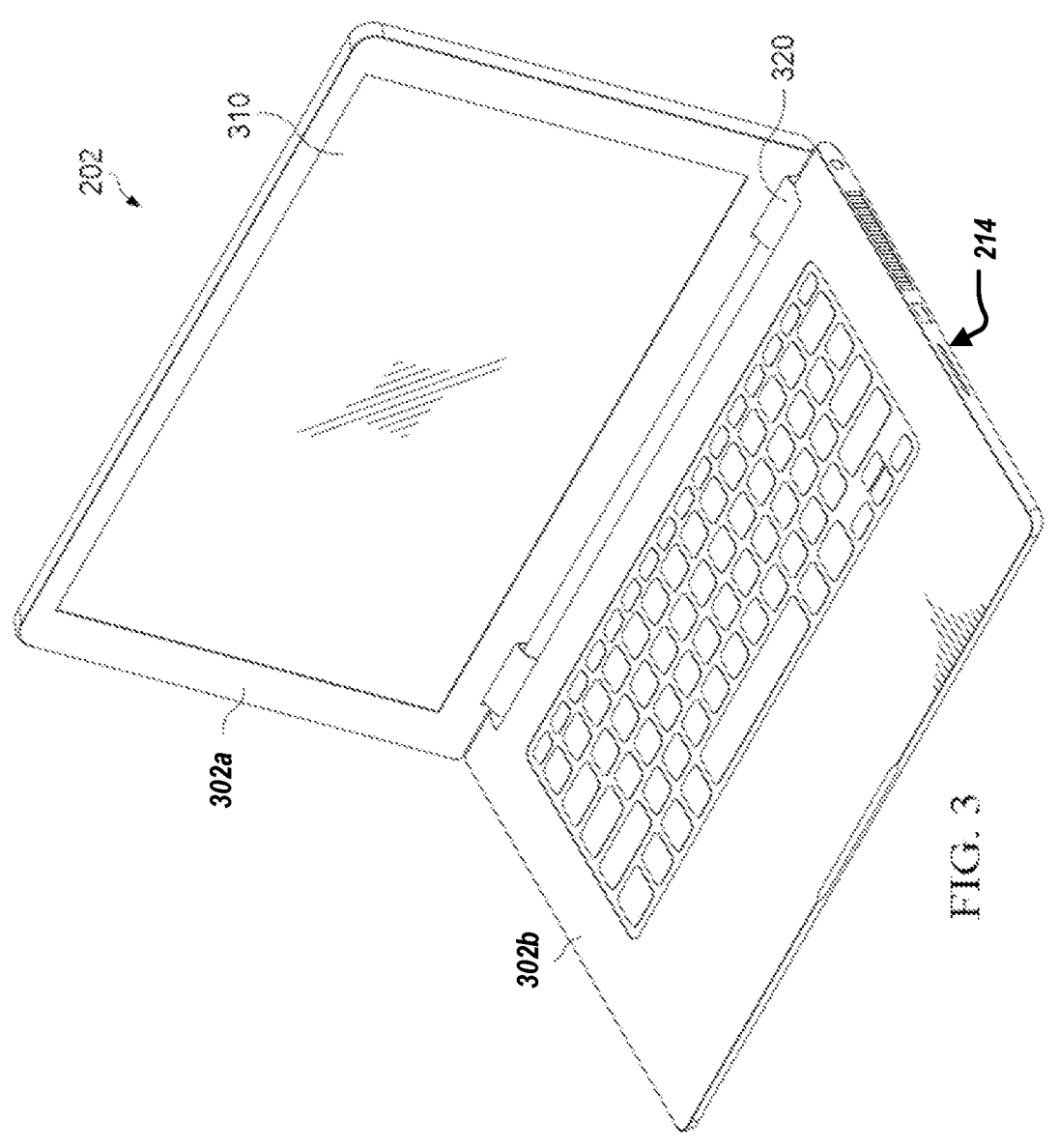
FIG. 3 illustrates a perspective view of the information handling system

Turning to FIG. 3, FIG. 3 illustrates a perspective view of the information handling system 202. The information handling system 202 can include a first body 302a and a second body 302b (collectively referred to as bodies 302). The first body 302a can include a display 310. A hinge 320 can couple the first body 302a to the second body 320b. The second body 302b can include the cover 214 (the "D cover"). In some examples, the information handling system 202 is similar to, or includes, the information handling system 100 of FIG. 1.

Figure 4A:
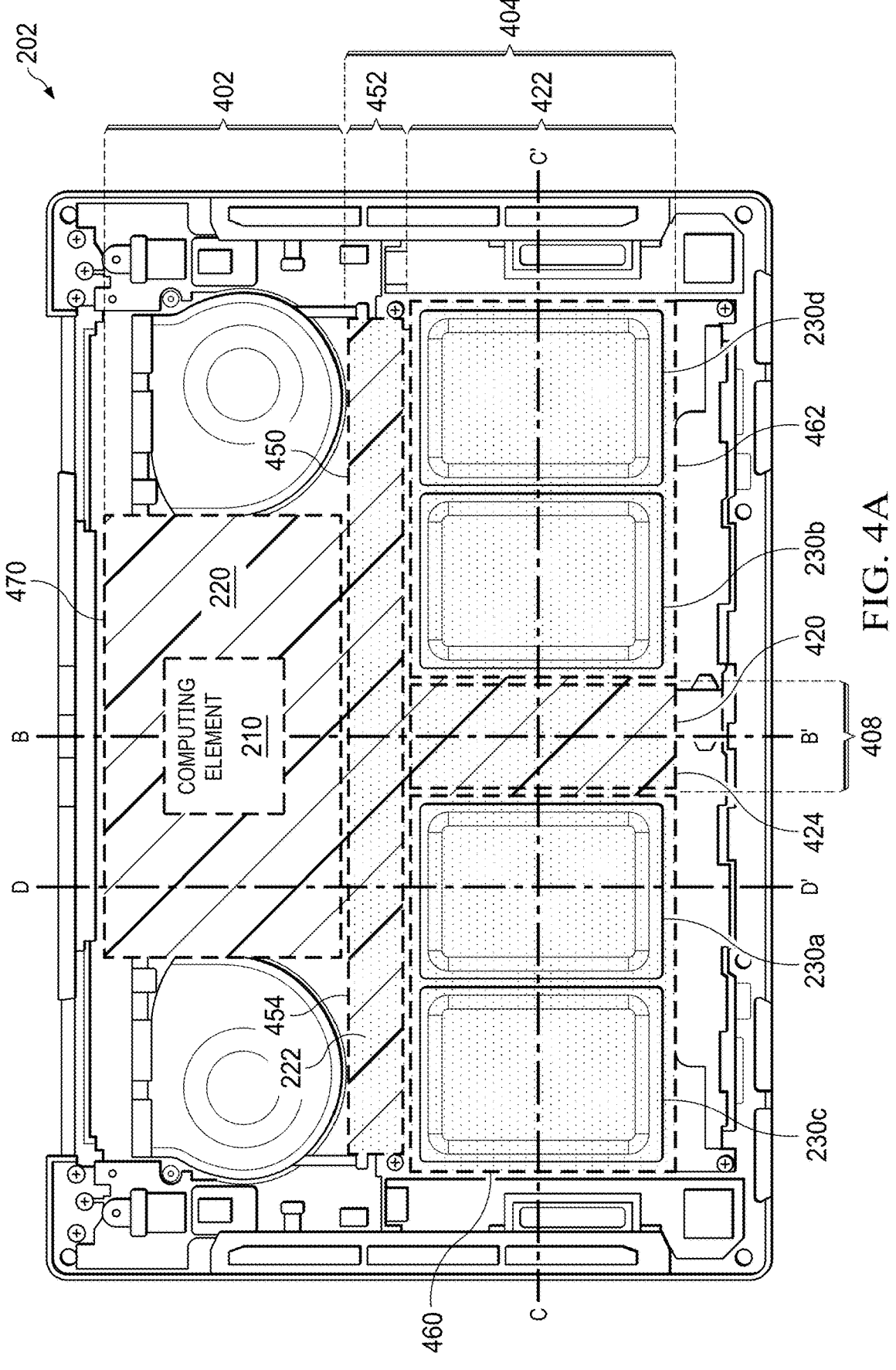
FIG. 4A illustrates a cutaway bottom up view of the information handling system.
Figure 4B:
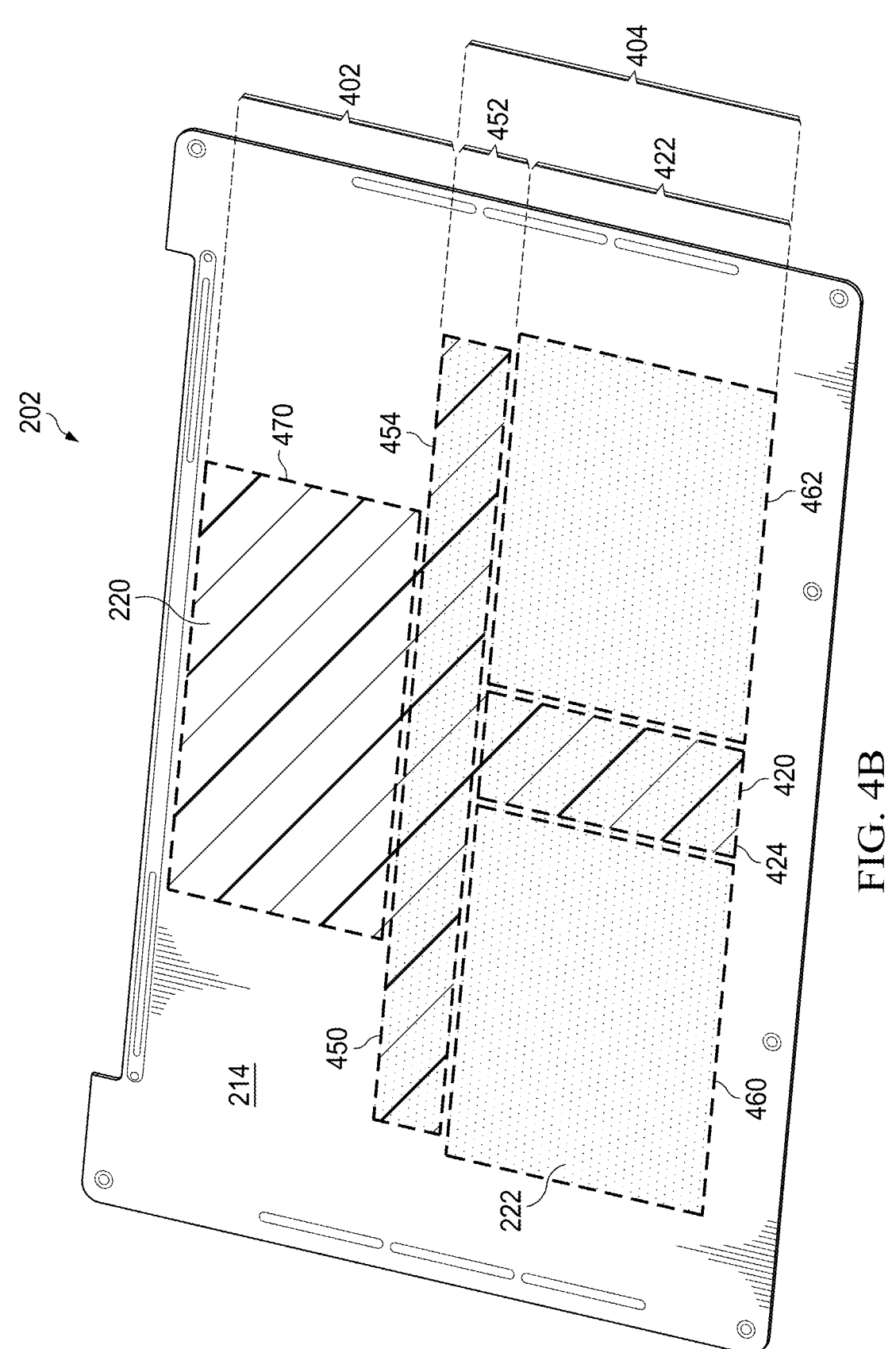
FIG. 4B illustrates a cutaway bottom up perspective view of the information handling system.

FIG. 4A illustrates a cutaway bottom up view of the information handling system 202; and FIG. 4B illustrates a cutaway bottom up perspective view of the information handling system 202. Referring to FIGS. 4A, 4B, the information handling system 202 can include the computing element 210 (dashed lines representing that the computing element 210 is positioned behind at least the graphite sheet 220 from the button up view of the information handling system 210). The computing element 210 can generate heat (or be a source of heat) that increases a skin temperature of the information handling system 202, and specifically, the cover 214.

The cover 214 can include a first section 402 and a second section 404. The battery cells 230 can be in superimposition with the second section 404 of the cover 214. The battery cells 230 can be coupled to the information handling system 202 via a battery frame 406 (shown in FIG. 6A).

Figure 5:
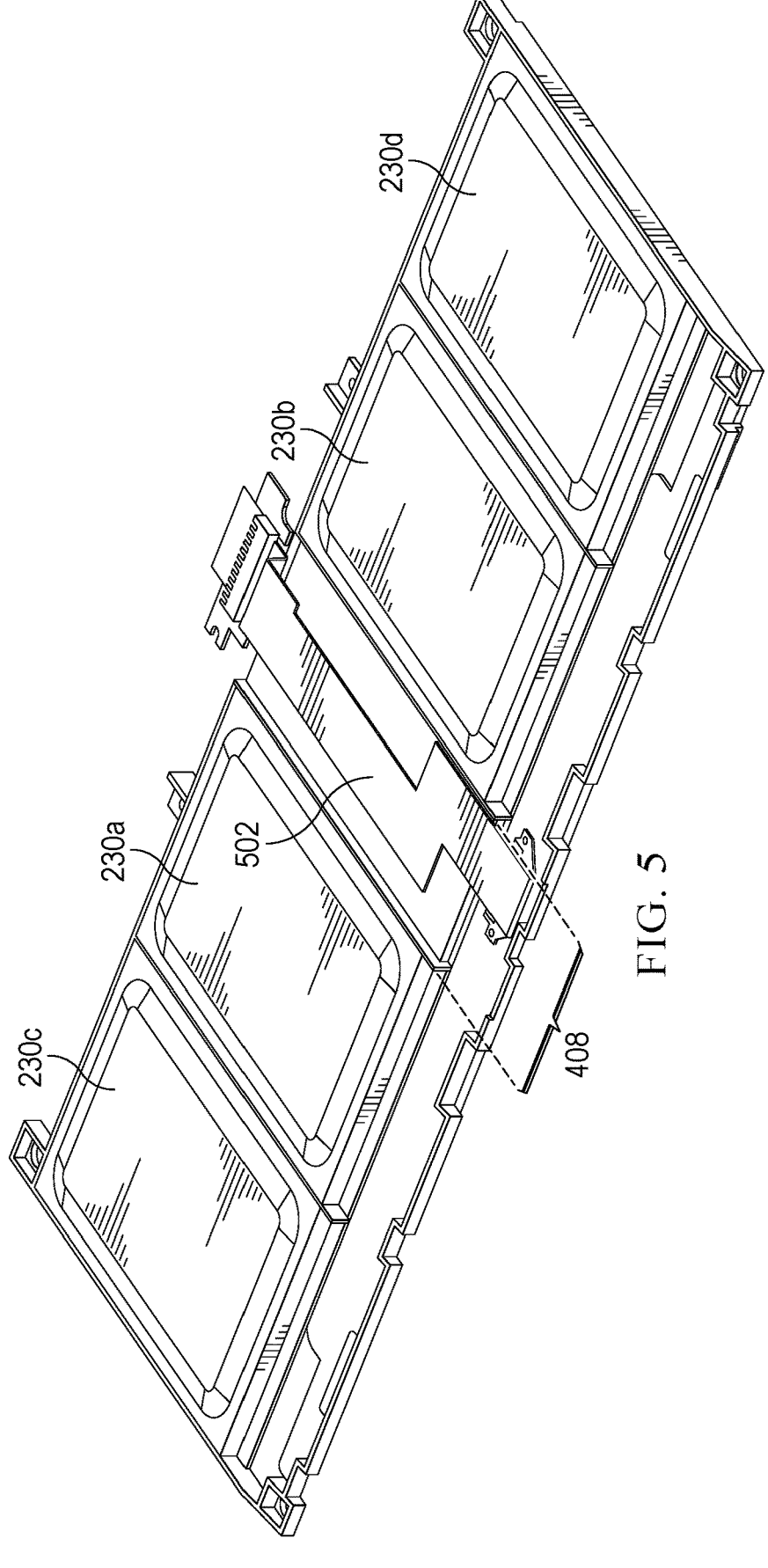
FIG. 5 illustrates a perspective view of a battery pack of the information handling system.

Referring to FIGS. 4A, 4B, and 5, in some examples, the battery 230a is spaced-part from the battery 230b to define a channel 408 therebetween. The channel 408 can facilitate routing of cables 502 of the information handling system 202.

The information handling system 202 can include the graphite sheet 220 and the graphene coating 222 (illustrated by hatching). The graphene coating 222 can be in superimposition with the second section 404 of the cover 214. The graphene coating 222 can be approximately 0.02 millimeters in thickness.

Figure 6A:
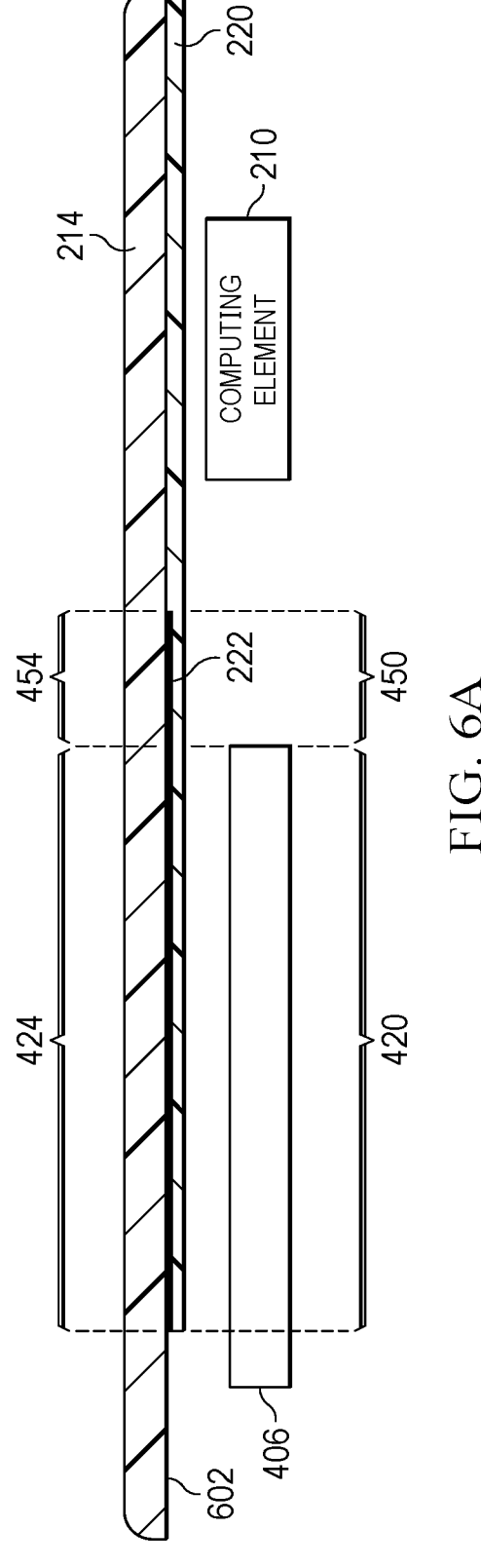
FIGS. 6A, 6C illustrate respective cutaway side views of the information handling system.
Figure 6B:
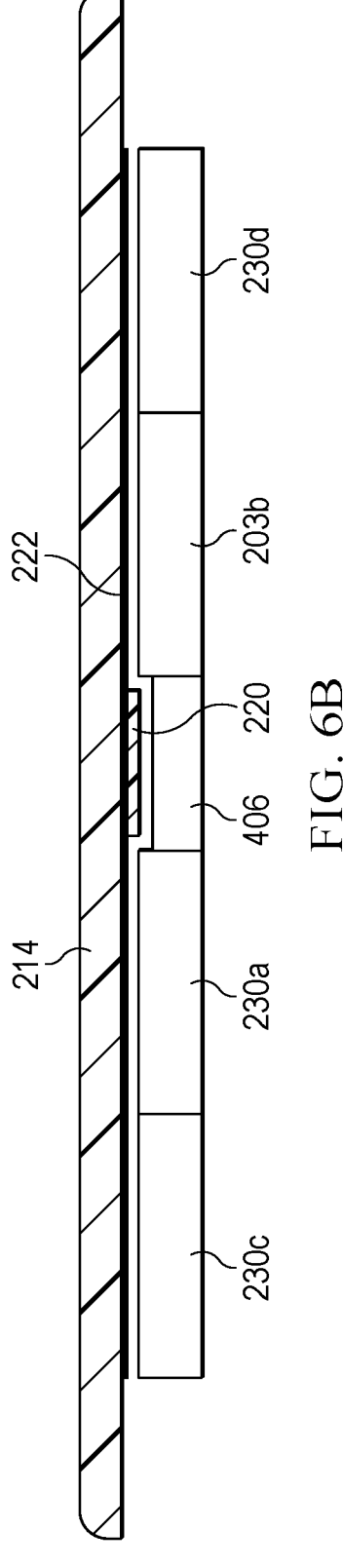
FIG. 6B illustrates a cutaway front view of the information handling system.
Figure 6C:
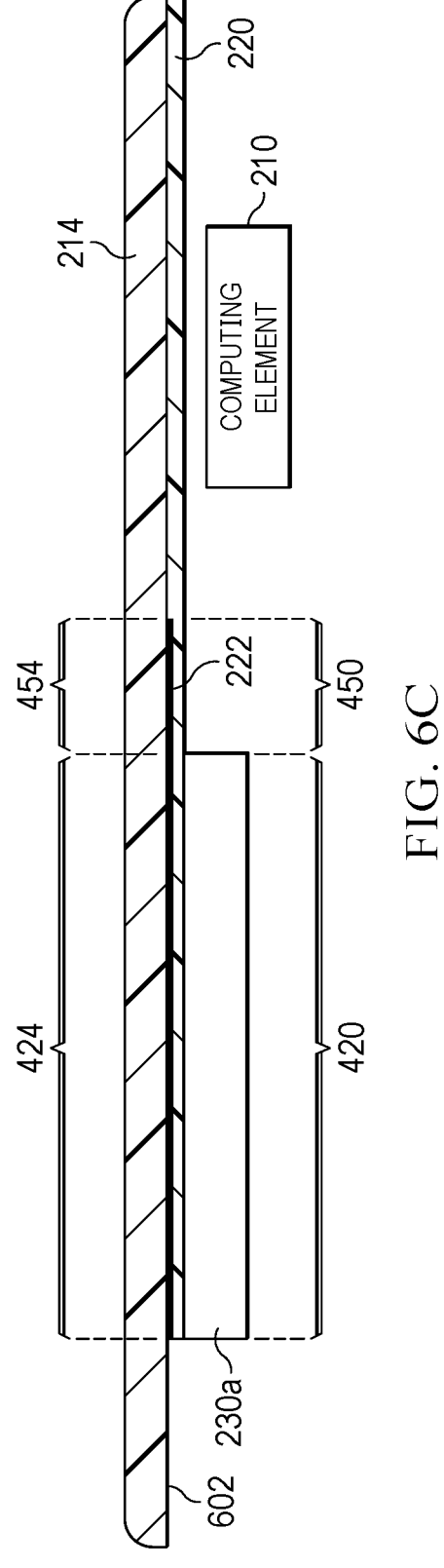

FIG. 6A illustrates a cutaway side view of the information handling system 202 along the line B-B'; FIG. 6B illustrates a cutaway front view of the information handling system 202 along the line C-C'; and FIG. 6c illustrates a cutaway side view of the information handling system 202 along the line D-D'.

Referring to FIGS. 4A, 4B, 6A, 6B, and 6C, a first portion 420 of the graphite sheet 220 is in superimposition with a first region 422 of the second section 404 of the cover 214. Furthermore, the first portion 420 of the graphite sheet 220 is in superimposition with the channel 408 defined between the battery 230a and the battery 230b. Additionally, the first portion 420 of the graphite sheet 220 is in superimposition with a first portion 424 of the graphene coating 222.

In some examples, the graphite sheet is between approximately 0.1 to 0.15 millimeters.

Thus, the first portion 420 of the graphite sheet 220 overlaps with the first portion 424 of the graphene coating 222. As a result, the graphene sheet 220 is in thermal communication with the graphene coating 222. To that end, heat generated by the computing element 210 can transfer from the computing element 210 to the graphene sheet 220 to the graphite coating 222, and in particular, to the first portion 420 of the graphene sheet 220 to the first portion 424 of the graphene coating 222. In other words, heat generated by the computing element 210 can transfer from the computing element 210 to the graphene sheet 220 to the graphite coating 222, and in particular, to the first portion 420 of the graphene sheet 220 to the first portion 424 of the graphene coating 222 to dissipate (or mitigate) heat at the information handling system 202 (and reducing a skin temperature of the cover 214).

In some examples, the first portion 424 of the graphene coating 222 is positioned between the first portion 420 of the graphite sheet 220 and the first region 422 of the second section 404 of the cover 214. That is, the graphene coating 222 is applied to an internal surface 602 of the cover 214. In some examples, the first portion 420 of the graphite sheet 220 is positioned between the first portion 424 of the graphene coating 222 and the first region 422 of the second section 404 of the cover 214.

In some examples, a second portion 450 of the graphite sheet 220 is in superimposition with a second region 452 of the second section 404 of the cover 214. Additionally, the second portion 450 of the graphite sheet 220 is in superimposition with a second portion 454 of the graphene coating 222.

In some examples, the second portion 454 of the graphene coating 222 is positioned between the second portion 450 of the graphite sheet 220 and the second region 452 of the second section 404 of the cover 214. That is, the graphene coating 222 is applied to the internal surface 602 of the cover 214. In some examples, the second portion 450 of the graphite sheet 220 is positioned between the second portion 454 of the graphene coating 222 and the second region 452 of the second section 404 of the cover 214.

The battery cells 230a, 230c are in superimposition with the first region 422 of the second section 404 of the cover 214. Additionally, the battery cells 230a, 230c are in superimposition with a third portion 460 of the graphene coating 222. The battery cells 230b, 230d are in superimposition with the first region 422 of the second section 404 of the cover 214. Additionally, the battery cells 230d, 230d are in superimposition with a fourth portion 462 of the graphene coating 222.

A third portion 470 of the graphite sheet 220 is in superimposition with the first section 402 of the cover 214.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. An information handling system, including:

a cover including a first section and a second section;

a computing element in superimposition with the first section, the computing element generating heat;

a first battery cell in superimposition with the second section of the cover;

a second battery cell in superimposition with the second section of the cover, the second battery cell spaced-apart from the first battery cell to define a channel therebetween;

a graphene coating in superimposition with the second section of the cover;

a first portion of a graphite sheet that is i) in superimposition with a first region of the second section of the cover, ii) in superimposition with the channel defined between the first battery and the second battery, and iii) in superimposition with a first portion of the graphene coating;

a second portion of the graphite sheet that is i) in superimposition with a second region of the second section of the cover and ii) in superimposition with a second portion of the graphene coating; and a third portion of a graphite sheet that is in superimposition with the computing element, wherein the second portion of the graphite sheet is i) positioned between the first portion of the graphite sheet and the third portion of the graphite sheet, and ii) positioned between the first portion of the graphite sheet and the first battery and the second battery, wherein the first portion of the graphite sheet, the second portion of the graphite sheet, the third portion of the graphite sheet and the first portion of the graphene coating dissipate the heat generated by the computing element.

2. The information handling system of claim 1, wherein the first battery cell is i) in superimposition with the first region of the second section of the cover and ii) in superimposition with a third portion of the graphene coating.

3. The information handling system of claim 2, wherein the second battery cell is i) in superimposition with the first region of the second section of the cover and ii) in superimposition with a fourth portion of the graphene coating.

4. The information handling system of claim 1, wherein the graphene coating is in thermal communication with the graphite sheet.

5. The information handling system of claim 1, wherein the first portion of the graphene coating is positioned between the first portion of the graphite sheet and the first region of the second section of the cover.

6. The information handling system of claim 1, wherein the first portion of the graphite sheet is positioned between the first portion of the graphene coating and a battery frame.

7. The information handling system of claim 1, wherein the second portion of the graphene coating is positioned between the second portion of the graphite sheet and the second region of the second section of the cover.

8. A heat dissipation apparatus for an information handling system, including:

a graphene coating in superimposition with a second section of a cover of the information handling system, the cover including a first section and the second section; and a first portion of a graphite sheet that is i) in superimposition with a first region of the second section of the cover, ii) in superimposition with a channel defined between a first battery and a second battery of the information handling system, and iii) in superimposition with a first portion of the graphene coating, the first battery and the second battery both in superimposition with the second section of the cover;

a second portion of the graphite sheet that is i) in superimposition with a second region of the second section of the cover and ii) in superimposition with a second portion of the graphene coating; and a third portion of a graphite sheet that is in superimposition with a computing element that is in superimposition with the first section of the cover, the computing element generating heat, wherein the second portion of the graphite sheet is i) positioned between the first portion of the graphite sheet and the third portion of the graphite sheet, and ii)

positioned between the first portion of the graphite sheet and the first battery and the second battery, wherein the first portion of the graphite sheet, the second portion of the graphite sheet, the third portion of the graphite sheet and the first portion of the graphene coating dissipate the heat generated by the computing element.

9. The heat dissipation apparatus of claim 8, wherein the graphene coating is in thermal communication with the graphite sheet.

10. The heat dissipation apparatus of claim 8, wherein the first portion of the graphene coating is positioned between the first portion of the graphite sheet and the first region of the second section of the cover.

11. The heat dissipation apparatus of claim 8, wherein the first portion of the graphite sheet is positioned between the first portion of the graphene coating and a battery frame.

12. The heat dissipation apparatus of claim 8, wherein the second portion of the graphene coating is positioned between the second portion of the graphite sheet and the second region of the second section of the cover.

* * * * *